US007217986B2

(12) United States Patent
Lacourse et al.

(10) Patent No.: US 7,217,986 B2
(45) Date of Patent: May 15, 2007

(54) METHOD FOR MODIFYING THE IMPEDANCE OF SEMICONDUCTOR DEVICES USING A FOCUSED HEATING SOURCE

(75) Inventors: Alain Lacourse, Laval (CA); Hugues Langlois, Montréal (CA); Yvon Savaria, Montreal (CA); Yves Gagnon, Montreal (CA)

(73) Assignee: Technologies Ltrim Inc., Laval, Quebec (CA)

( * ) Notice: Subject to any disclaimer, the term of this patent is extended or adjusted under 35 U.S.C. 154(b) by 0 days.

(21) Appl. No.: 11/088,720

(22) Filed: Mar. 25, 2005

(65) Prior Publication Data

US 2005/0186766 A1   Aug. 25, 2005

Related U.S. Application Data

(62) Division of application No. 10/631,825, filed on Aug. 1, 2003, now Pat. No. 6,890,802.

(30) Foreign Application Priority Data

Aug. 14, 2002   (CA)   ................................. 2398166

(51) Int. Cl.
*H01L 29/00* (2006.01)
*H01L 21/82* (2006.01)
(52) U.S. Cl. ........................ 257/531; 438/131
(58) Field of Classification Search ............. 438/131, 438/132, 467, 601; 257/529–531, 781, 784
See application file for complete search history.

(56) References Cited

U.S. PATENT DOCUMENTS 5,110,758 A   5/1992   Baskett 6,329,272 B1   12/2001   Gagnon et al.

FOREIGN PATENT DOCUMENTS

EP   0 472 331   2/1992
JP   59100646   5/1984

OTHER PUBLICATIONS

Shier, John "A Finite-Mesh Technique for Laser Trimming of Thin-Film Resistors" The Journal of Solid-State Circuits, vol. 23, No. 4, Aug. 1998 pp. 1005-1009.
Parker D L et al: "Polysilicon Resistor trimming by laser link making" IEEE Transactions on semiconductor manufacturing, IEEE inc. New York, US, vol. 3, No. 2, May 1, 1990 pp. 80-83.

*Primary Examiner*—Calvin Lee
(74) *Attorney, Agent, or Firm*—BCF LLP; Ronald S. Kosie; Gaetan Prince

(57) ABSTRACT

A method is provided for tuning (i.e. modifying, changing) the impedance of semiconductor components or devices using a focused heating source. The method may be exploited for finely tuning the impedance of semiconductor components or devices, by modifying the dopant profile of a region of low dopant concentration (i.e. increasing the dopant concentration) by diffusion of dopants from adjacent regions of higher dopant concentration through the melting action of a focused heating source, for example a laser. The present invention is in particular directed to the use of lasers in relation to circuits for the creation of conductive links and pathways where none existed before. The present invention more particularly relates to a means wherein impedance modification (i.e. trimming or tuning) may advantageously be carried out as a function of the location of one or more conductive bridge(s) along the length of a gap region.

4 Claims, 9 Drawing Sheets

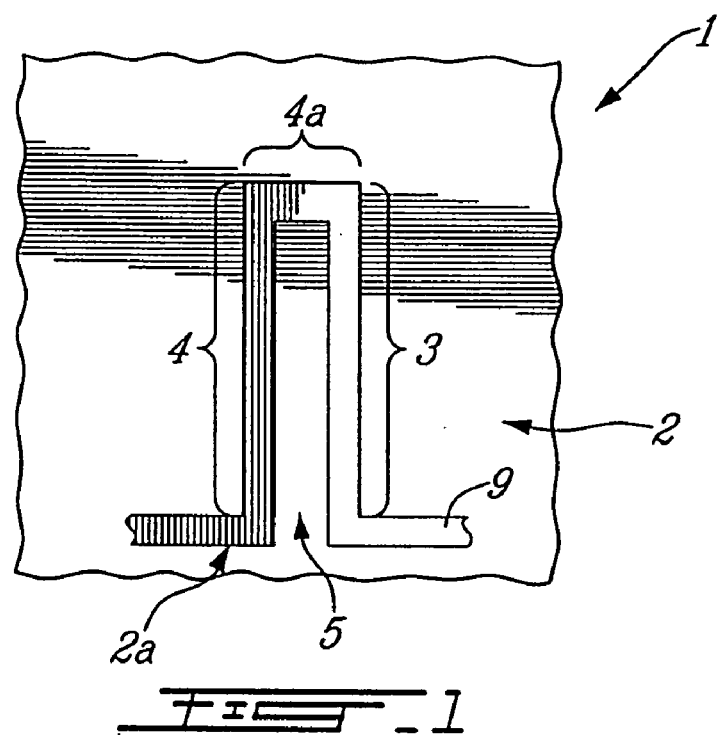
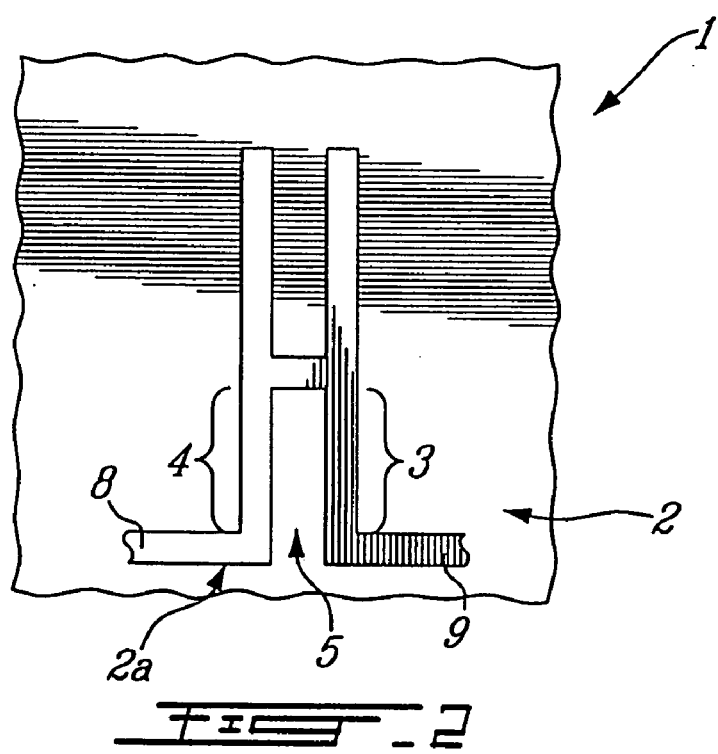

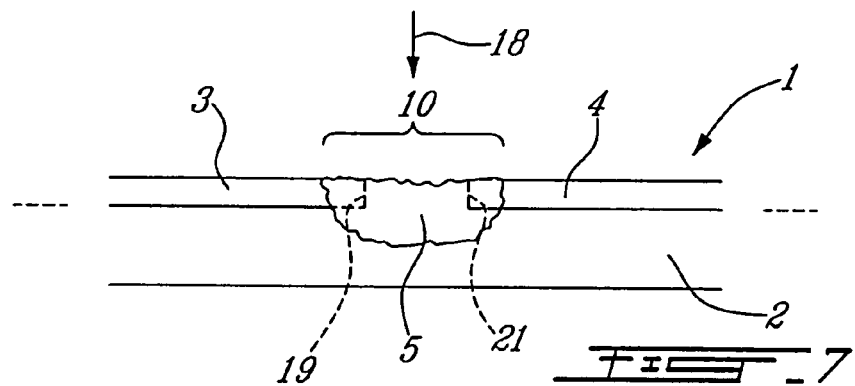
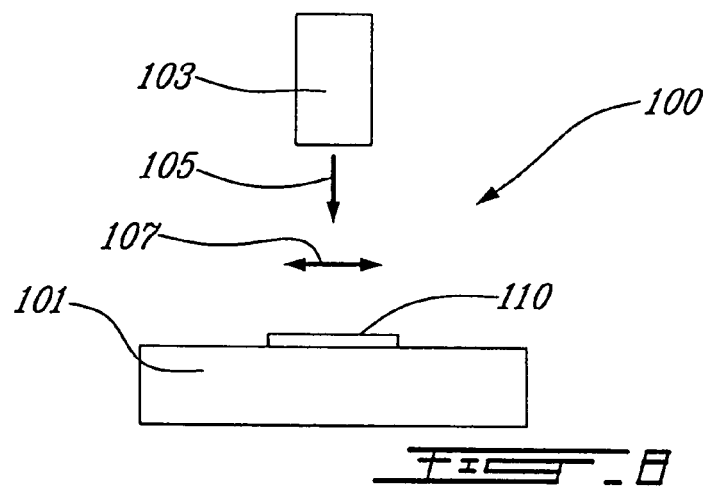
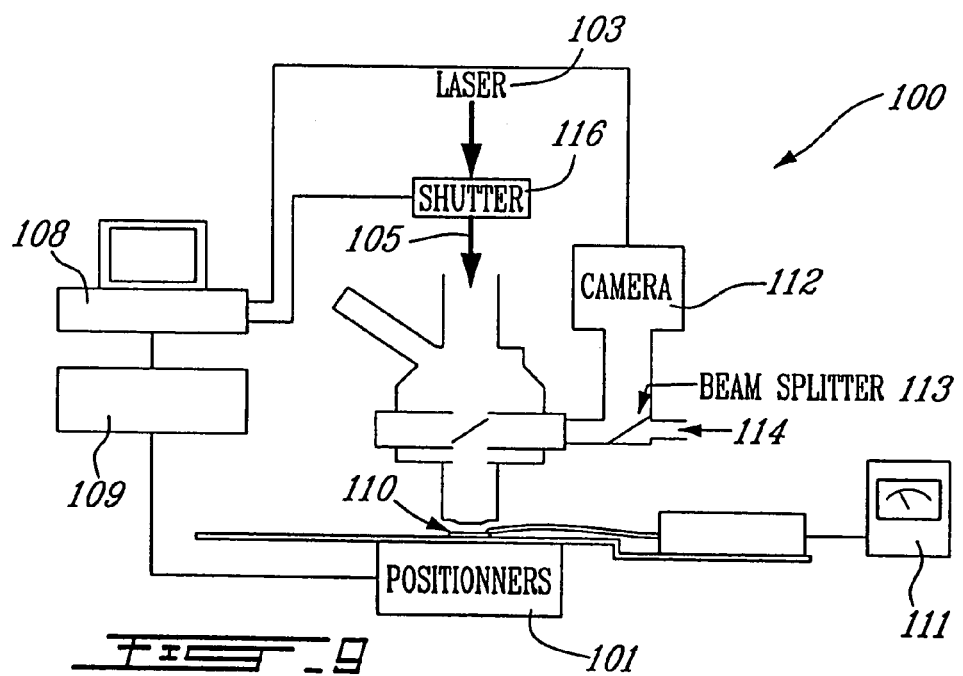

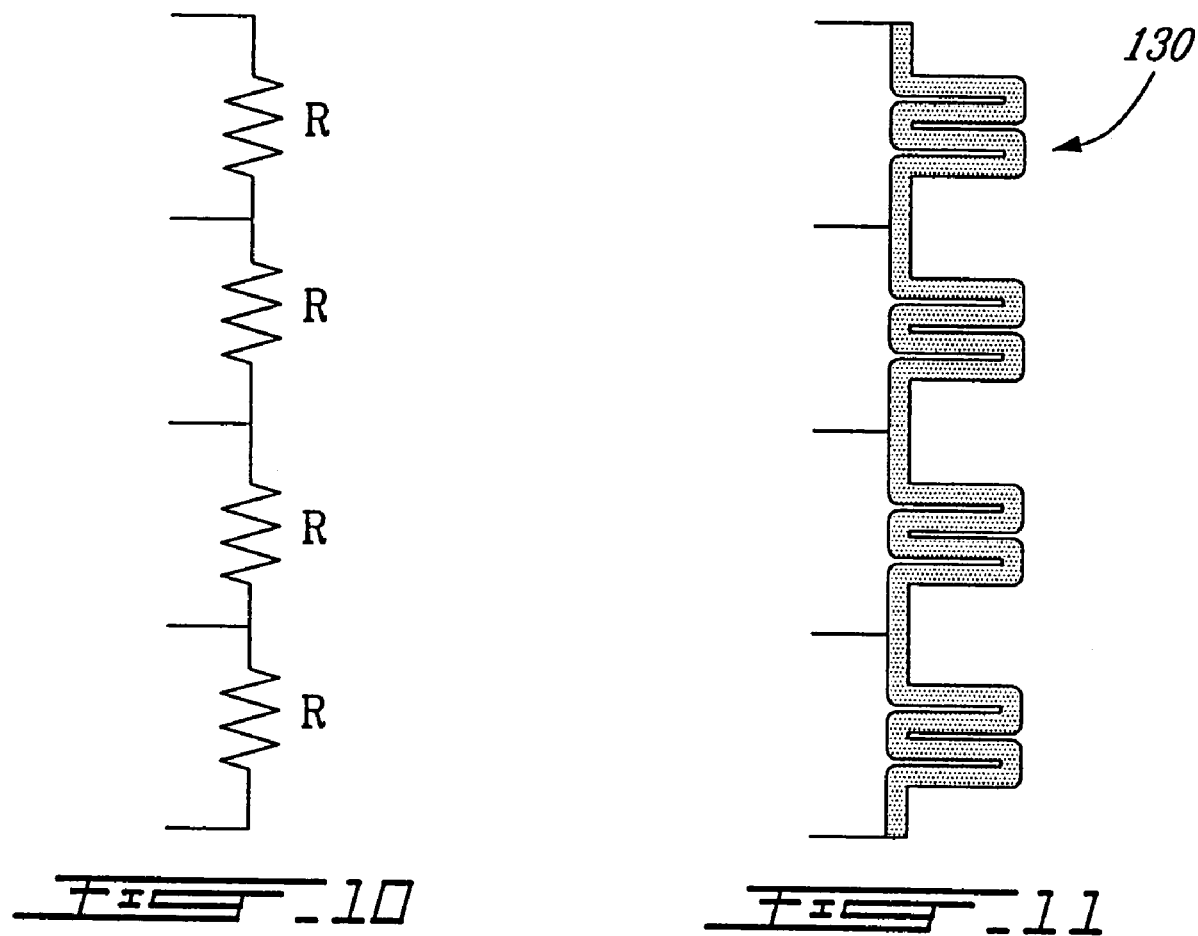

METHOD FOR MODIFYING THE IMPEDANCE OF SEMICONDUCTOR DEVICES USING A FOCUSED HEATING SOURCE

The present is a Divisional of U.S. patent application Ser. No. 10/631,825 filed on Aug. 1, 2003 and issued as U.S. Pat. No. 6,890,802.

The present invention relates to the field of semiconductor components or devices, and is directed to a method and apparatus for tuning (i.e. modifying, changing) the impedance of semiconductor components or devices using a focused heating source.

The method may be exploited for finely tuning the impedance of semiconductor components or devices, by modifying the dopant profile of a region of low dopant concentration (i.e. increasing the dopant concentration) by diffusion of dopants from adjacent regions of higher dopant concentration through the melting action of a focused heating source; the heating source may take any form whatsoever keeping in mind its purpose as described herein; it may for example be able to provide an energy beam such as, for example, a laser. The present invention is in particular directed to the use of lasers in relation to circuits for the creation of conductive links and pathways where none existed before. The present invention more particularly relates to a means wherein impedance modification (i.e. trimming or tuning) may advantageously be carried out as a function of the location of one or more conductive bridge(s) along the length of a gap region.

Modifying the impedance of a (integrated) semiconductor device or component through the use of lasers is known in the art. Such methods, sometimes known as laser trimming of (integrated) semiconductor devices is most often performed on a semiconductor device or component having a resistive thin film structure, manufactured with materials such as silicon chromide, cesium silicides, tantalum nitride or nichrome. The trimming of the (integrated) semiconductor device or component, in order to achieve a required or desired impedance value may be obtained by laser ablation, (i.e. by evaporation, or burning off), of a part of the resistive thin film. In other word, the laser is used to evaporate a portion of a resistive thin film structure, which due to the change in the amount of resistive thin film that remains, causes a change in the impedance value of the (integrated) semiconductor device.

It is also known to iteratively selectively tune the impedance of (integrated) semiconductor devices or components, by modifying the dopant profile of a region; see for example U.S. Pat. No. 6,329,272 the entire contents of which is incorporated herein by reference.

It would be advantageous to have relatively simple means for lowering the resistance (i.e. impedance) of integrated resistors, i.e. to be able to use lasers or other focused heat sources to modify the impedance (i.e. decrease the impedance) of an integrated semiconductor device. It would also be advantageous to have an alternative method for iteratively, selectively tuning the impedance of integrated semiconductor devices through the use of a focused heating source, for example an energy beam such as a focused laser beam. It would also in particular be advantageous to be able to lower the impedance of an integrated semiconductor device by creating one or more secondary conductive paths, (i.e. electrically conductive path(s)) rather than (solely) by attempting to accurately control the diffusion of dopant from one region to another.

It would be advantageous to have a semiconductor device or component wherein in accordance with the present invention the base (or main) conductive path (as laid down) of the device has an initial (i.e. non-infinite) impedance (e.g. non-infinite resistance) and has a configuration whereby the main conductive path is capable of being trimmed or tuned by decreasing such impedance.

Therefore, the present invention, in accordance with a general aspect provides for a method for modifying the impedance of a semiconductor component, said semiconductor component comprising a first conductive region defining a laid down base conductive path (i.e. initial path), said first conductive region comprising a first link member (or portion) and a second link member (or portion), said first region being a doped region having a heat modifiable dopant profile and a second region contiguous with the first region, said second region being a doped region having a dopant profile rendering said second region non-conductive relative to said first region, said first and second link members being disposed in juxtaposition such that said first and second link members are separated by a gap region defined by said second region, said second region having a heat modifiable dopant profile, at least with respect to said gap region, said method comprising applying a bridging cycle to one or more (i.e. at least one) preselected bridging areas, each said bridging area comprising a gap region component comprising at least a portion of the gap region, a first link component comprising at least a portion of said first link member, and a second link component comprising at least a portion of said second link member, so as to form a discrete conductive bridge across said gap region connecting said first link member and said second link member, said bridging cycle comprising applying one or more heating/cooling treatments to one or more preselected target areas of a bridging area, each heating/cooling treatment comprising directing a focused heating source to melt a preselected target area of a bridging area so as to thereby alter the dopant profile of the melted preselected target area and allowing said melted preselected target area to solidify with an altered dopant profile.

The present invention in accordance with another aspect provides a method for modifying the impedance of a semiconductor device or component as defined herein wherein the first conductive region comprises a conductive crimp element, (i.e. at least a part of the first conductive region being disposed in the form of a conductive crimp or fold element), the conductive crimp element defining the base (i.e. initial) conductive path, and said crimp element comprising the first link member and the second link member.

The present invention in accordance with a further aspect provides for a method for modifying the impedance of a semiconductor component, said semiconductor component comprising a first laid down conductive region comprising a first conductive link member (or portion) and a second link member (or portion), said first region being a doped region having a heat modifiable dopant profile, said first conductive link member defining a laid down base conductive path (i.e. initial path)

and
- a second region contiguous with the first region, said second region being a doped region having a dopant profile rendering said second region non-conductive relative to said first region,
- said first and second link members being disposed in juxtaposition such that said first and second link members are separated by a gap region defined by said second region, said second region having a heat modifiable dopant profile, at least with respect to said gap region,
- said method comprising applying a bridging cycle to one or more (i.e. at least one) preselected bridging areas,
- each said bridging area comprising a gap region component comprising at least a portion of the gap region, a first link component comprising at least a portion of said first link member, and a second link component comprising at least a portion of said second link member, so as to form a discrete conductive bridge across said gap region connecting said first link member and said second link member, said bridging cycle comprising applying one or more heating/cooling treatments to one or more preselected target areas of a bridging area, each heating/cooling treatment comprising
- directing a focused heating source to melt a preselected target area of a bridging area so as to thereby alter the dopant profile of the melted preselected target area
and
- allowing said melted preselected target area to solidify with an altered dopant profile.

In accordance with a method of the present invention a bridging cycle,
- when a preselected target area comprises a bridging area (i.e. the gap region component and both of said first and second link components of the bridging area), comprises applying a heating cooling treatment to the bridging area so as to form thereby said discrete conductive bridge.

Also in accordance with a method of the present invention a bridging cycle,
- when a preselected target area comprises the gap region component and one of said first and second link components of a bridging area, comprises applying a heating cooling treatment to such preselected target area and applying one or more other heating cooling treatments to one or more preselected target areas of the bridging area so as to form thereby said discrete conductive bridge.

The present invention also relates to a semiconductor device or component which may be subjected to the herein described bridging cycle(s). Thus in accordance with another aspect the present invention provides an impedance tunable semiconductor component, said semiconductor component comprising
- a first conductive region defining a laid down base conductive path, said first conductive region comprising a first link member (or portion) and a second link member (or portion), said first region being a doped region having a heat modifiable dopant profile and
- a second region contiguous with the first region, said second region being a doped region having a dopant profile rendering said second region non-conductive relative to said first region,
- said first and second link members being disposed in juxtaposition such that said first and second link members or portions are separated by a gap region defined by said second region, said second region having a heat modifiable dopant profile, at least with respect to said gap region.

As mentioned herein the first conductive region may for example comprise a conductive crimp element defining the laid down base conductive path, said crimp element comprising said first link member and said second link member.

The present invention in another aspect also provides an impedance tunable semiconductor component, said semiconductor component comprising
- a first laid down conductive region comprising a first conductive link member (or portion) and a second link member (or portion), said first region being a doped region having a heat modifiable dopant profile, said first conductive link member or portion defining a base conductive path and
- a second region contiguous with the first region, said second region being a doped region having a dopant profile rendering said second region non-conductive relative to said first region,
- said first and second link members being disposed in juxtaposition such that said first and second link members or portions are separated by a gap region defined by said second region, said second region having a heat modifiable dopant profile, at least with respect to said gap region.

The present invention, in particular, provides an impedance tunable semiconductor component, said semiconductor component comprising
- a first laid down conductive region defining a laid down base conductive path, said first conductive region comprising a first conductive element and a second conductive element, said first region being a doped region having a heat modifiable dopant profile, said first conductive element defining said base conductive path and
- a second region contiguous with the first region, said second region being a doped region having a dopant profile rendering said second region non-conductive relative to said first region, said second conductive element comprising first and second conductive members being disposed in juxtaposition such that said first and second conductive members are separated by a gap region defined by said second region, said second region having a heat modifiable dopant profile, at least with respect to said gap region. In accordance with the present invention an impedance tunable semiconductor component is provided wherein said first and second conductive members may each be linked to said first conductive element by a respective laid down conductive connector member.

The present invention, in particular, also provides an impedance tunable semiconductor component, said semiconductor component comprising
- a first laid down conductive region defining a laid down base conductive path, said first conductive region comprising a first conductive member spaced apart from a second conductive member, said first region being a doped region having a heat modifiable dopant profile, said first conductive member defining said base conductive path and
- a second region contiguous with the first region, said second region being a doped region having a dopant profile rendering said second region non-conductive relative to said first region, said first and second conductive members being disposed in juxtaposition such that said first and second conductive members are separated by a gap region defined by said second region, said second region having a heat modifiable dopant profile, at least with respect to said gap region. In accordance with the present invention an impedance tunable semiconductor component is provided wherein said first and second conductive members may be linked together by a laid down conductive connector member.

Turning back to the method aspect of the present invention, a conductive bridge may be obtained by application of a bridging cycle comprising a single laser or heat pulse over a (complete) bridge area. Thus a bridging cycle may comprise applying a heating/cooling treatment to a bridge area (i.e. complete bridge area), the heating/cooling treatment comprising directing a focused heating source to melt the bridging area so as to thereby alter the dopant profile of the melted bridging area and allowing said melted bridging area to solidify with an altered dopant profile so as to form thereby said discrete conductive bridge. If desired or needed, however, a bridging cycle may comprise applying, after an initial heating cooling treatment, one or more additional heating cooling treatments to the same bridging area so as to form thereby said discrete conductive bridge, i.e. a bridging cycle may comprise applying two or more of the heating cooling treatments to the same bridging area.

Alternatively, a conductive bridge may by obtained by the application of a bridging cycle comprising a series of sequential or simultaneous laser or heat pulses which target a plurality of dopant modifiable regions or areas of a bridge area, i.e. laser pulses may be applied over adjacent regions of heat alterable dopant profiles. These regions or areas may extend from one link member across the gap region to the other link member (i.e. of the preselected bridge area). Additionally, if desired or needed, a bridging cycle may further comprise applying two or more of the heating cooling treatments to the same preselected target area of a bridging area so as to form thereby said discrete conductive bridge. A bridging cycle may for example use heating stages such as for example as described in above mentioned U.S. Pat. No. 6,329,272 Thus for example a bridging cycle may comprise applying two or more of the heating cooling treatments to respective preselected target areas of a bridging area so as to form thereby said discrete conductive bridge, and wherein one of said preselected target areas is a first area which comprises the gap region component and one of said first and second link components, and another of said preselected target areas is a second area which comprises the gap region component and the other of said first and second link components, said first and second areas overlapping one another.

In accordance with the present invention, as desired or necessary, a bridging area may be subjected to a combination of the above described total area and/or partial area heating cooling treatments.

It is to be understood herein that the word "impedance" relates to both resistance and capacitance, and that modifying the impedance of an integrated semiconductor device is understood to comprise modifying the resistance and/or the capacitance of a semiconductor device or component, as the case may be.

In accordance with the present invention it is to be understood herein that the reference to a "laid down base conductive path" (i.e. initial conductive path) of a device or component is a reference to a conductive path having an initial (i.e. non-infinite) impedance (e.g. non-infinite resistance) prior to any type of tuning or trimming as discussed herein.

In accordance with the present invention it is further to be understood herein that the reference to a "focused heating source" or the like, is a reference to any type of heating source of any kind whatsoever whereby one is able to direct, concentrate or apply energy to a predetermined target area (i.e. a target area as described herein) so as to heat the target area for the purpose of altering the dopant profile thereof.

In accordance with the present invention, a method as described herein may further include the steps of a) determining the impedance of said semiconductor device component subsequent to a bridging cycle and b) comparing the impedance obtained from step a) with a predetermined impedance and c) if necessary, repeating, said bridging cycle, until said predetermined impedance is achieved.

As may be appreciated from the above, in accordance with the present invention if more than one bridging cycle is needed or deemed necessary, any such additional bridging cycle may be applied, as needed or desired to a previously treated pre-selected area and/or to one or more different pre-selected areas. A bridging cycle may thus be re-applied to an already treated area or to a fresh (i.e. untreated) area(s). For example, bridging cycles may be applied to a number of different pre-selected areas (e.g. two or more such areas) so as to form respective discrete conductive bridges. More particularly, for example, if necessary or desired, a bridging cycle may be repeated, at one or more additional preselected areas, until the predetermined impedance is achieved, each bridging cycle being applied to a different pre-selected area to form a respective discrete conductive bridge.

In accordance with the present invention if more than one conductive bridge is needed or deemed necessary, any such additional conductive bridge(s) may be disposed on either side of the initial conductive bridge.

As may be appreciated, in accordance with the present invention, impedance modification (i.e. trimming or tuning) may advantageously be carried out as a function of the location of a conductive bridge along the continuous length of the gap region.

In accordance with the present invention, a crimp element may take on any suitable, desired, appropriate or necessary configuration keeping in mind that the first and second link members or portions thereof are to be disposed in juxtaposition such that the first and second link members or portions are separated by a gap region defined by the second region and that the crimp or fold element is to define a (main) conductive path. The gap region may for example have a constant width or a width which increases or decreases in size. Thus for example, a conductive crimp element may have a U-like shape wherein the lateral arms or legs of the U-shaped crimp element are interconnected by a spacer member or portion. The first and second link members or portions may each have a respective first contact or connection end for electrically connecting the crimp element other elements of a semiconductor device. The spacer member or portion is connected to each of the first and second link portions at a position away from the respective first ends of the first and second link portions.

Alternatively the crimp or fold element may have a H-like shape, a saw-tooth like shape etc. . . .

As a further alternative the first conductive region may define two or more (e.g. adjacent or spaced) crimp or fold elements. The first conductive region may for example define two or more adjacent crimp or fold elements such that the first conductive region may have, a V-like shape, a W-like shape, a zig-zag-like shape or the like.

As may be understood a discrete conductive bridge as formed herein defines a secondary conductive path which electrically connects the first link portion and the second link portion across the gap region.

In accordance with the present invention the semi-conductor component or device, before any trimming or tuning as described herein, is already an electrical conductor having an initial (non-infinite) impedance which may already be near the sought after value, i.e. the initial value is higher than the desired end value. In other words, it is further to be understood herein that a tunable semiconductor component or, device and the like in accordance with the present invention is a semiconductor component, device etc already having a gross impedance obtained as a result of the initial manufacturing process of laying down appropriate layers, substrates etc. . This means that the semiconductor construct, device or component has a measurable impedance which may be tested even before being subjected to any type of trimming or tuning as described herein i.e. the semiconductor device or component has, as mentioned above, a "base conductive path" even before the application of any laser tuning process, i.e. it has a base conductive path which is a "laid down base conductive path".

More particularly, in accordance with the present invention the impedance of a construct or device may for example be altered, inter alia, as a function of the position and number of discrete conductive bridges in relation to a conductive crimp element or the like.

In other words, for example, if a semiconductor device or component a) is provided with one or more a conductive crimp or fold elements, and b) each crimp or fold element has an appropriate configuration i). so as to define an initial or conductive path (i.e. of non-infinite impedance,)
and ii) so as to have at least one gap region (i.e. a gap spannable by a heat produced discrete conductive bridge) spacing apart opposed portions of the initial or base conductive path, the physical location and the number of discrete conductive bridges spanning a given gap region, may advantageously be used as parameters or adjustment or tuning factors for adjusting the impedance (e.g. resistance) of the base conductive path of the device or component.

It is to be understood herein that the expression "heat modifiable dopant profile" characterizes a region or area (as the case may be) as being one which may, on the application of a suitable heat source, be melted such that dopant may migrate or diffuse there through so as to alter the dopant profile thereof which may be maintained on solidification of the melted area.

Another advantage of the present invention relates to the temperature coefficient for the device or semi-conductor component; the variation of the temperature coefficient of the heat produced (e.g. laser) link(s) (i.e. laser produced bridges) may only hardly or weakly affect the overall temperature coefficient of the device since the heat produced (e.g. laser) link(s) may be so configured as to contribute in only a small part to the total overall resistance (i.e. impedance) of the device.

A further advantage of the present invention relates to the long term stability of the device or semi-conductor component; the variation of the long term stability of the heat produced (e.g. laser) link(s) may only hardly or weakly affect the overall long term stability of the device since the heat produced (e.g. laser) link(s) may be so configured as to contribute in only a small part to the total overall long term stability of the device.

In accordance with the present invention, a heat produced (e.g. laser) link (i.e. bridge) between opposed portions of the main conductive path may account for only a part of the total desired resistance (i.e. impedance) of the device. Therefore to obtain a tolerance of 0.1% with respect to the total resistance (i.e. impedance) of the device, the required tolerance with respect to the resistance (i.e. impedance) of the laser induced links may perhaps each only need be on the order of 1.0%. The ability to relax the level of precision for the production of the heat produced (e.g. laser) links means less control needs to be applied to the tuning process and can lead to a faster laser tuning process. Depending on the dimension and/or geometry of a semiconductor device or component it may be possible to achieve resistance tolerance as low as 0.001%.

In accordance with an embodiment of the present invention, there is provided for a method of tuning (i.e. modifying or decreasing) the impedance of an (integrated) semiconductor device or component through the exploitation of one or more bridging cycles each of which induces the diffusion of dopants from side or lateral areas having a high dopant concentration (i.e. a higher concentration) to an intermediate (i.e. gap) area of lower dopant concentration.

As mentioned above, in accordance with the present invention a conductive bridge or link may be obtained by application of a single heat (e.g. laser) pulse; alternatively a conductive link may by obtained by the application of a series of pulses such as for example as described in above mentioned U.S. Pat. No. 6,329,272.

In accordance with the present invention a conductive bridge may, if so desired or appropriate be formed by a controlled diffusion, i.e. it may be formed by a careful, calculated and measured application of focused energy being applied to the integrated semiconductor device, which may result in a controlled and/or determinable quantity of dopants being diffused from one area to an adjacent area having a lower dopant concentration.

Alternatively, in accordance with the present invention, a conductive bridge may, for example, advantageously, be formed from the application of an indiscriminate pulse from a high powered laser (i.e. a blast of energy); the pulse spanning across the gap region over a part of each of the link portions and being applied so as to a provide (under pregiven conditions) a degree of diffusion which may vary from the minimum amount of diffusion (necessary to provide a conductive bridge) to a maximum amount of diffusion which likewise results in a desired conductive bridge.

In accordance with the present invention, semiconductor components or devices may be tuned, which expression (tuned or tuning) is understood to mean that the impedance of the integrated semiconductor device may be modified, adjusted, changed, (i.e. decreased). It is further understood that fine tuning of an integrated semiconductor device is understood to mean that the impedance, once it has been grossly obtained (i.e. by the initial manufacturing process of laying down appropriate layers, substrates etc.), may be finely tuned (i.e. finely adjusted, or with high precision). Fine tuning may involve a single step or a distinct series of steps.

In accordance with an embodiment of the present invention, the tuning of an integrated semiconductor device may be accomplished iteratively, i.e. through the use of an iteration technique or method. Thus, iteratively or iteration technique is to be understood to mean a process, action or procedure in which repetition of a sequence of operations yields results which are successively closer to a desired result. Therefore, the objectives of a particular embodiment of the present invention may be accomplished through the use of an iteration technique, by which the successive application of heat (i.e. one or more pulses) from a focused heating source to different areas, may progressively yield an impedance profile which is progressively closer to the required or desired profile across a given integrated semiconductor device.

For example, a first laser application (i.e. first bridge cycle) to a first location may result in 80% of the required impedance change, a second laser application (i.e. second bridge cycle) to a second location may result in 91% of the required impedance change, a third laser application (i.e. third bridge cycle) to a third location may result in 98% of the required impedance change, and a fourth laser application (i.e. fourth bridge cycle) to a fourth location may result in 100% of the required impedance change. It is understood however that a greater or lesser number of laser applications may be required to achieve the required or desired impedance change, and it is further understood that the required impedance change may be achieved with as little as one or two laser applications.

In accordance with a general embodiment of the present invention, an integrated semiconductor device may comprise a number of components. Included among these may be areas which may be doped with dopants, such as for example, n type or p type dopants. The dopant concentration of various areas of a device may vary according to their use and application, and there may be, for example, areas of a given dopant concentration, and adjacent thereto there may be areas of higher or lower dopant concentration. In accordance with an embodiment, there may therefore be a pair of first areas of a predetermined or selected dopant concentration, and an adjacent intermediate second area of a (relative) lower dopant concentration. As may be understood, the difference in the dopant concentration between areas may be sufficient such that the physical and electrical properties of each of the areas may be different, i.e. for example, one may conduct electrical current, while the other may not, or their relative capability to conduct electrical current may be different. The present invention therefore addresses a method for modifying the relative current carrying capacities of adjacent areas of an integrated semiconductor device by modifying the relative dopant concentration difference of said areas.

By way of example, in accordance with the present invention, in order to modify the relative dopant concentration difference between first doped areas and an intermediate second doped area having a lower dopant concentration, the following iterative steps may be effected. Namely, a focused heating source may be targeted at a selected area, which selected area may comprise therein a portion of the first doped areas, and a portion, or the intermediate second doped area, i.e. the selected area may straddle the boundary between the first and the second doped areas. As may be understood, the selected area may be generally round, and may or may not evenly straddle the boundaries between the first and the second doped region.

The target area or location for a first conductive bridge may be determined by first testing the actual impedance (e.g. resistance) of the base or main conductive path; determining the resistance unit length for the base path; determining the amount by which the resistance must be lowered (i.e. ΔR resistance) to reach a desired predetermined overall resistance; determining the path length equivalent to the ΔR resistance; and then calculating the position of a desired conductive bridge across the gap region which will provide an at least initial desired overall lowering of the resistance.

As may be appreciated such calculations may be based on known equations for the calculation for series, parallel, series-parallel, etc. circuits This may of course be done by an appropriately configured computer means.

Once the selected location or area has been targeted, there may be applied to the selected area a (heating) pulse from a focused heating source, which heating pulse causes the selected area to melt, i.e. to change from the solid stated to the liquid state. As may be understood, portions of the first doped areas and portions of the second doped area which are outside of the selected area will not be caused to be melted by the application of the heating pulse.

The period during which the selected area may be melted may be long or short, (e.g. of the order of 10 femtosecond to 10 microseconds long). In any event the period of time during which the selected area may be melted is of course to be sufficient to allow the diffusion (i.e. migration) of dopants from the first areas to the second area of lower dopant concentration. The diffusion of dopants from an area of higher dopant concentration to an area of lower dopant concentration occurs in accordance with well known principles. The (controlled) diffusion may therefore take place very rapidly, such that even during a short time during which the selected area may be melted, sufficient dopants may diffuse which may cause an appreciable change in the dopant concentration of the area of lower dopant concentration.

As mentioned, the melted area may only remain in a liquid state for a short period of time, i.e. for a period of time substantially the same as the length of application of the heating pulse. Once the selected melted area has solidified, the dopant profile of the selected area may therefore have been modified, and may therefore be of a concentration which is intermediate the dopant concentration of the first areas and the second area of lower dopant concentration.

Once the preceding step has been accomplished, further steps in an iterative process may be undertaken. For example, the next step may comprise the determination, i.e. the testing of the new impedance of the integrated semiconductor device achieved as a result of the application of the first heating pulse. This testing may be conducted in accordance with any known or desired method, and the results may be compared with the required or desired end result.

Depending on the impedance value of the integrated semiconductor device achieved as a result of the prior iterative steps and depending on the final impedance which is required or desired, it may be necessary to perform a further iterative step of the method. For example, if the impedance has not been sufficiently decreased, a further application of a focused heating source may be made to a different pre-selected area (i.e. different location) in order to further decrease the impedance. Namely, the application of a further (i.e. second) focused heating source may further melt (all, or part of) the other pre-selected area of the integrated semiconductor device, thus forming an additional conductive bridge, as described above.

Once the additional melted area has solidified, a further step in the iterative process may involve the re-testing of the resulting impedance and the comparison of this resulting impedance with the required desired result. If the resulting impedance is still not what is required or desired, a further iterative step may be performed similar to the process as described above.

As may be understood, in accordance with an example embodiment of the present invention, the iterative process involves in its most general form the application of a heating pulse which may cause a modification in the relative dopant concentration of adjacent and abutting areas of an integrated semiconductor device, the testing of the impedance resulting from the application of said heating pulse, and if required or desired, the repetition of the bridge cycle. As may be further understood, subsequent to the determination of the resulting impedance following the application of a heating pulse, some or all of the characteristics of the subsequent heating pulse or pulses may be modified, i.e. adjusted. The characteristics of the heating pulses which may be modified are varied, and may depend on how much of a further modification of the impedance the next application of the heating pulse is required to achieve. Thus, for example, if after the application of one heating pulse, it is determined that the impedance has reached a substantial percentage of the required result, the characteristics of the next focused heating pulse may be modified, as an example, the power of the focused heating source may be decreased. As a further example, the length of the application of the heating pulse may be decreased, all in order to bring the impedance as close as possible to a required result. Further, the angle of application of the heating source may be varied, i.e varied from a 90° angle application. In addition, a different heating source may also be employed. Subsequent to the application of a modified heating pulse, if the integrated semiconductor device is further tested and it is determined that, for example, substantially all of the required or desired impedance change has been achieved, the characteristics of the heating pulse may be further modified, i.e. the power of the heating pulse may again be further reduced, the length of application of the heating pulse may also be further reduces etc. . . It is however possible that the characteristics of any of the subsequent heating pulses may be increased for a subsequent application, i.e. some or all of the power of the heating pulse, the length of application, etc. . . may be increased. In other words, not all of the applied heating pulses may be identical, however it is foreseen that as the impedance is iteratively brought closer to the desired end-value, the characteristics of the focused heating source may be decreased, or lowered.

More particularly, in accordance with of the present invention, there may be provided for an integrated semiconductor device which may be configured and disposed such that it comprises, two conductively interconnected areas or regions of relatively high dopant concentration which are spaced apart by a gap area or region of a relatively lower dopant concentration. Thus the area of lower dopant concentration may act as an insulator, between the two areas of higher dopant concentration. The dopant type and/or concentration thereof of the area of lower dopant concentration may be of a type and/or of a low enough concentration such that no or at least essentially no electrical current may flow there through.

It is understood that for some electrical current to pass through a bridge area of lower dopant concentration disposed between two areas of higher dopant concentration, it is necessary to arrange that the type of dopant in the areas be identical, i.e. either all of n type, or all of p type. In accordance with this embodiment, the method of the present invention may be used to modify the dopant concentration of a part of the gap region thereof, therefore decreasing the preexisting impedance of any part of an integrated semiconductor device. In other words the use of the method of the present embodiment may allow for the impedance of an integrated semiconductor device to be modified such that some electrical current (i.e. as opposed to no electrical current) may be able to flow across a conductive bridge spanning a gap region.

The type of dopant (or dopants) used in the lightly (i.e lower) doped region may, however, not be the same as the type of dopant use in the heavily (i.e. higher) doped regions. For example, if the heavily doped region uses a p type dopant, the lightly doped region can be either p type or n, and vice versa. It is understood that in this case, the amount of dopant to be diffused from the area (or areas) of higher dopant concentration into the area of lower dopant concentration may need to be high enough to counter the presence of the different type of dopant present in the lightly doped area, such that current may flow through said lightly doped area.

The level of concentration of the dopants in the areas of high and low concentration may vary significantly. For example, the dopant concentration may vary between $10^{12}$ to $10^{20}$ atoms per $cm^3$. The range of dopant concentration for a lightly doped area may, for example, be between $10^{12}$ to $10^{16}$ atoms per $cm^3$ while the dopant concentration for an area of high dopant concentration may, for example, be between $10^{16}$ to $10^{20}$ atoms per $cm^3$. In any event, the dopant concentration(s) may be those (normally) encountered in industry, i.e. they may be higher or lower than mentioned herein above.

It is understood that the terms lightly doped region and heavily doped region are not meant to exclude a first doped region which dopant concentration is only slightly higher than a second doped region (depending on dpant type). The dopants which may be used in accordance with the present invention may be selected from the group comprising boron, phosphorus, aluminum, antimony, arsenic, gallium, indium, lithium, thallium and bismuth. The dopants may be doped in a substrate comprising a material selected from the group comprising silicon, gallium arsenide, silicon-germanium, compounds selected from columns III–V and II–VI of the periodic table, and compounds having a IV—IV alloy.

Although the present invention is discussed herein by way of example in relation to laser heat sources, the "focused heating source" which may be used in accordance with the present invention may, as mentioned above, be any (e.g. known) source suitable for the purposes herein; it may for example be a suitable configured device using an electron beam (e.g. the heat source may be selected from a group comprising a laser and an electron beam). Further, the energy of the heating pulses of said focused heating source may be low enough to avoid damaging the integrated semiconductor device.

Example embodiments of the present invention are illustrated in the drawings wherein;

FIG. 1 illustrates schematically an example of a tunable semiconductor component or device in accordance with the present invention, wherein the first conductive region is disposed in the form of a conductive crimp element having a U-like shape configuration or pattern;

FIG. 2 illustrates schematically another example of a tunable semiconductor component or device in accordance with the present invention, wherein the first conductive region is disposed in the form of a conductive crimp element having a H-like shape configuration or pattern;

FIG. 7 illustrates a cross-sectional view of through a bridge of the tunable integrated semiconductor device as shown in FIG. 5;

FIG. 8 illustrates a schematic view of the laser system used for the tuning process;

FIG. 9 illustrates a more complete view of the schematic view of the laser system shown in FIG. 8;

FIG. 10 illustrates an example electric schematic of a series resistor ladder which may be used in an analogue to digital converter;

FIG. 11 illustrates how a plurality of the integrated semiconductor device as shown in FIG. 5 may be disposed so as to define the series resistor ladder of FIG. 10;

Figure 5:
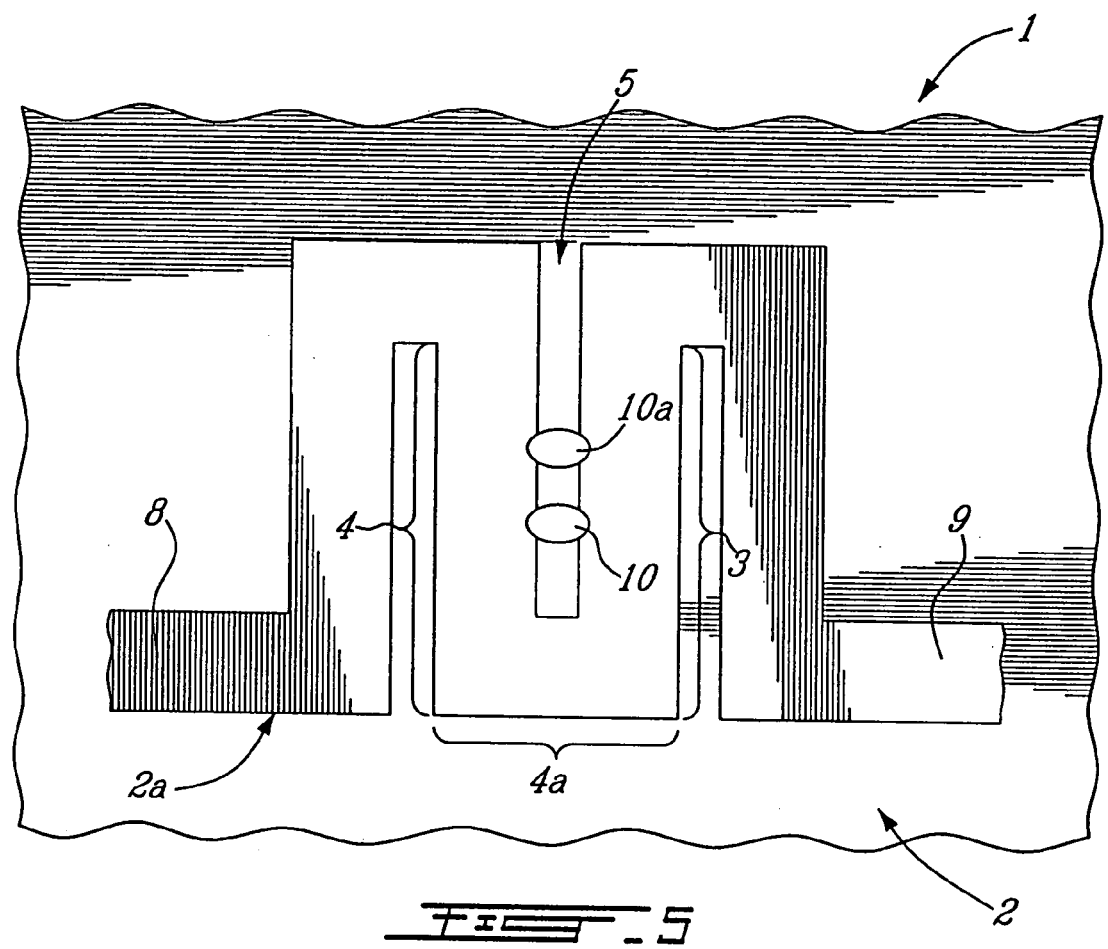
FIG. 5 illustrates schematically another example of a tunable semiconductor device in accordance with the present invention, wherein the first conductive region is disposed in the form of a plurality (i.e. 3) of conductive crimp elements each having a U-like shape configuration or pattern.
Figure 14:
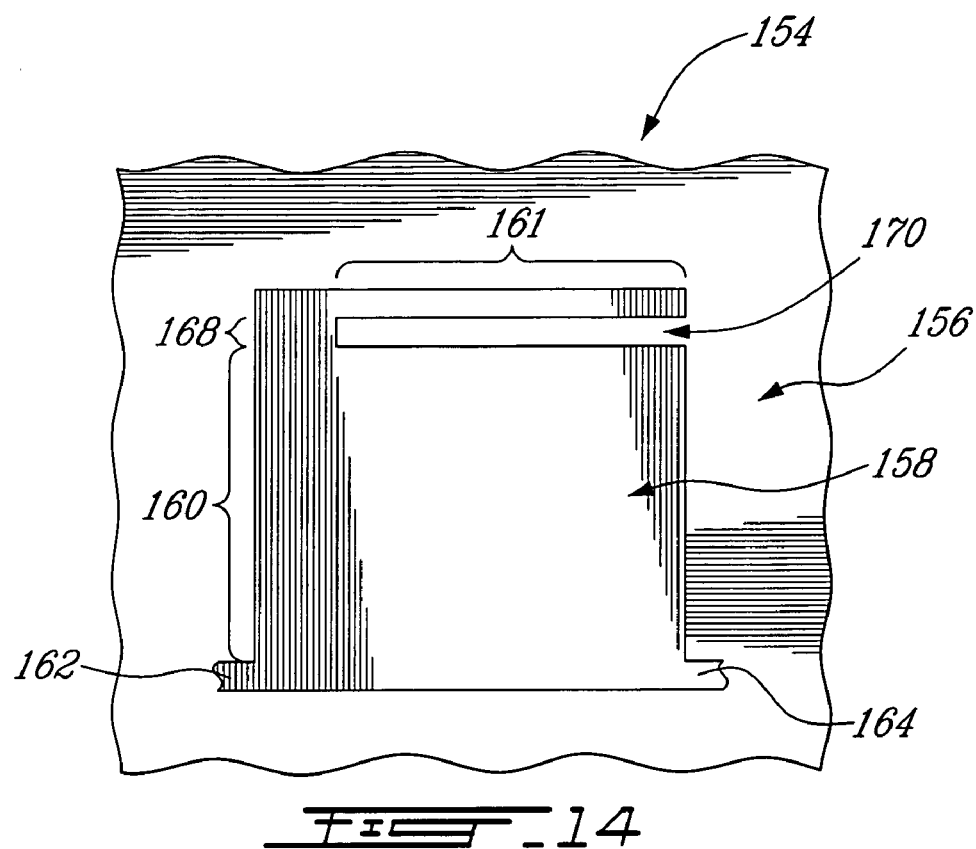
Figure 15:
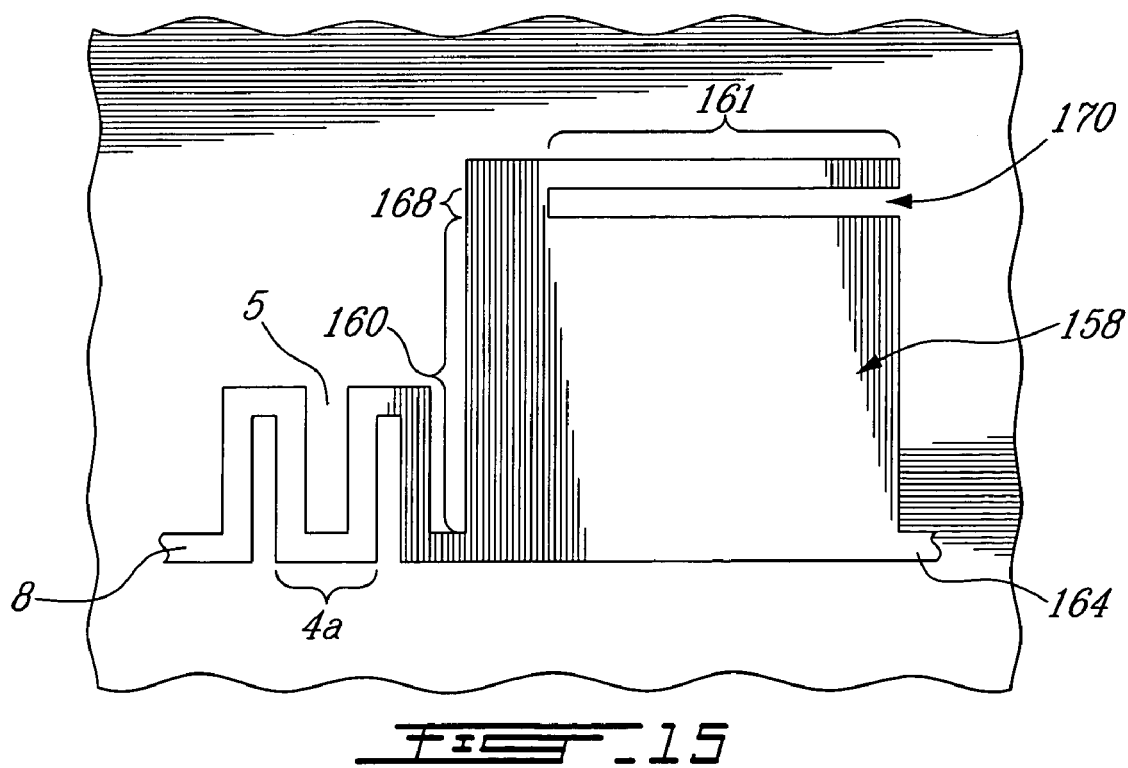
Figure 16:
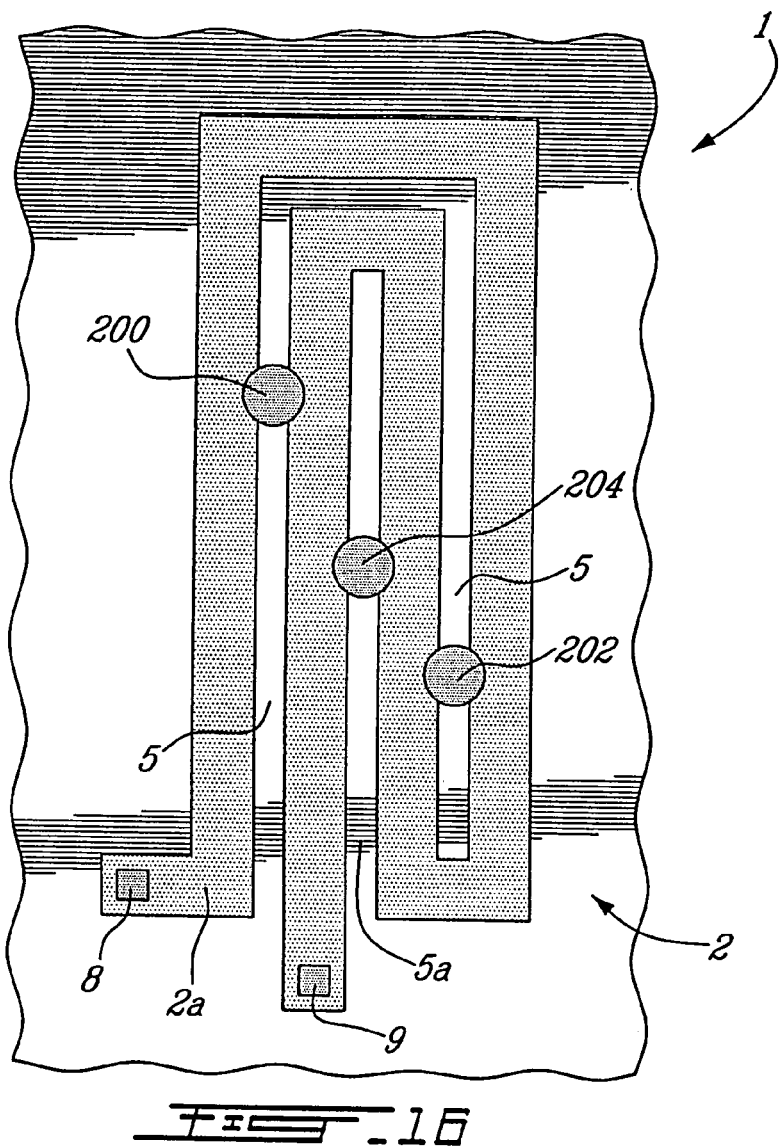
Figure 17:
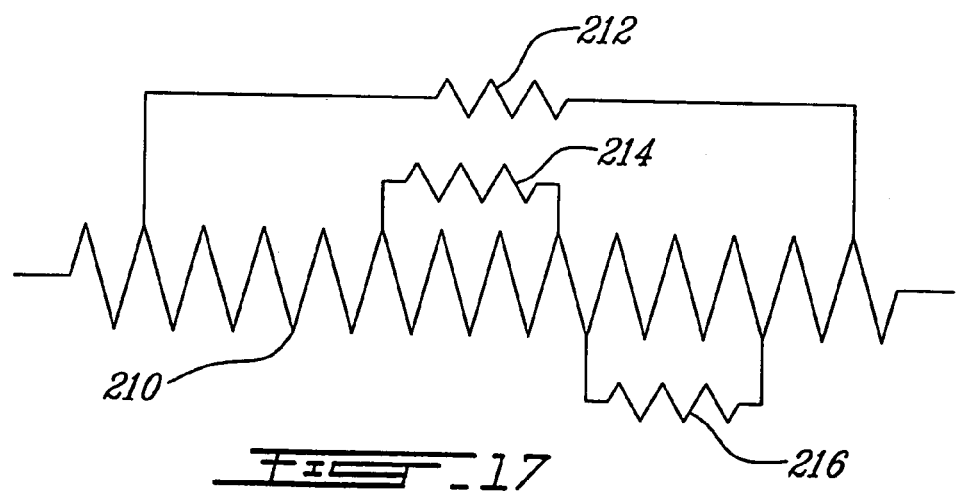

FIG. 14 schematically illustrates an example of another tunable integrated semiconductor component or device of the present invention wherein one of the link members or portions of the crimp or fold element is not (initially) in the main conductive path;

FIG. 15 schematically illustrates an example combination of an integrated semiconductor device as shown in FIG. 5 with an integrated semiconductor device as shown in FIG. 14 to provide a device of higher precision than would be obtainable by the device of FIG. 5 alone;

FIG. 16 illustrates schematically a further example of a tunable semiconductor component or device in addition to those as set forth in FIGS. 1 to 5 in accordance with the present invention, wherein the conductive region is disposed in the form of a conductive crimp element as set out in FIG. 1 wherein the top portion is bent over downwardly, the device being provided with three (3) conductive bridges; and FIG. 17 illustrates an electric schematic of a tuned semiconductor component or device having the aspect of the device of FIG. 16.

FIGS. 1 to 5 illustrate example embodiments of a tunable semiconductor component or device in accordance with the present invention; the same reference numerals will be used for each of these figures to denote common or analogous elements. For each of FIGS. 1 to 5 the tunable semiconductor component or device is generally designated by the reference numeral 1. The device 1 in each case may comprise various layers or regions, for example, a non-conductive substrate or region 2, and a conductive layer or region 2a which is contiguous with the underlying substrate or region 2.

The regions 2 and 2a may each comprise semiconductor materials such as silicon, germanium, gallium arsenide, silicon-germanium or other suitable semiconductor materials selected from a group comprising elements from columns III–V, or columns II–VI of the periodic table, or compounds having a IV—IV alloy.

The region 2a is a heavily doped region, i.e. an electrically conductive region having a heat modifiable dopant profile. As mentioned above, the expression "heat modifiable dopant profile" characterizes a region or area (as the case may be) as being one which may, on the application of a suitable heat source, be melted such that dopant may migrate or diffuse there through so as to alter the dopant profile thereof which may be maintained on solidification of the melted area.

The region 2a as illustrated in FIGS. 1 to 5 has a first link member or portion 3 and juxtaposed therewith a second link member or portion 4. Referring pin particular to FIGS. 1 and 5, the devices illustrated also have a spacing link member or portion 4a which links the first and second portions together. The first and second link portions 3 and 4 are spaced apart by gap region 5 which is defined by the general region 2. The gap region 5 may, as shall be discussed in more detail with respect to FIG. 5, be spanned by one or more conductive bridges. The device also has contact or connecter members 8 and 9 for electrically connecting the region 2a to other devices, current is at least initially able to pass through the entire region 2a between these contact members.

As may be understood, a heavily doped region may be heavily doped with either n or p type dopants in sufficient concentrations, and of a required or desired profile such that the heavily doped region is electrically conductive. For example, the dopants may be phosphorous, and may be of a concentration of the order of between $10^{16}$ to $10^{20}$ atoms per cm$^3$. The thickness of the heavily doped regions may for example be of 0,25 micrometers, but may be greater or lesser in accordance with the requirements of a given manufacturing process. Further, the configuration and disposition of such a heavily doped region may also be in accordance with the requirements of a given manufacturing process.

The region 2 as mentioned above comprises the gap region 5 which is disposed intermediate the first and second link portions 3 and 4 of the region 2a. The gap region 5 may have width dimension which, in light of the initial fabrication process, may for example, vary from the minimum size possible up to about 20 microns or more; the gap width may for example vary in accordance with the type of heat pulse treatment to be used; e.g. if a single pulse is to be used then as small a width as possible may be in order; if a series of heat pulses is to be used then a large width may be contemplated.

The region 2 has a dopant profile such that it is electrically non-conductive relative to the region 2a. Thus, the region 2 may be a lightly doped region. In any event, the region 2a as in the case of the region 2, at least in the gap region has a heat modifiable dopant profile. The gap region 5 may have a dopant profile which is the same as that of the rest of region 2; alternatively, the gap region 5 may have a dopant profile which is different from that of the rest of the region 2 provided that the dopant profile of the gap region is nevertheless such that the gap region is electrically non-conductive relative to the region 2a and in particular relative to the first and second link portions 3 and 4 thereof.

If a region is lightly doped it may be doped with the same dopant as the heavily doped region, or alternatively, may comprise a different dopant than that present in the adjacent heavily doped region. A lightly doped gap region 5 may be disposed to be adjacent to and abutting heavily doped first and second link portions 3 and 4. The type and concentration level of dopants in a lightly doped gap region 5 may be such that, prior to the application of the method steps in accordance with an embodiment of the present invention, no electrical current may flow across the gap region 5 between heavily doped portions 3 and 4, i.e. wherein the resistance of lightly doped region 5 is high enough to prevent (most if not all) electrical current to flow between heavily doped portions 3 and 4. As may be understood, if the type of dopant of the lightly doped region is different from the type of dopant of the heavily doped region, the device will be equivalent to two diodes in opposite polarity which will not allow any electrical current to pass there through.

Although not shown in FIGS. 1 to 5 the semiconductor component or device may comprise an overlaying passivation layer, such as silicon nitride $Si_3N_4$. Further, the device may also comprise an oxide layer underlying the passivation layer, such as silicon dioxide $SiO_2$.

FIG. 5 shows a component or device with three crimp elements wherein the link portions of one crimp element may serve as a common link elements for an adjacent or neighboring link element; the crimp elements thus have a serpentine like aspect. For illustration purposes only the link portions of the central crimp element are designated with the reference numerals 3 and 4. The three crimp elements may have a width of about 9 microns an a height of about 11 microns. The central crimp element is shown with two discrete solidified conductive bridges or links 10 and 10a spanning across gap region 5, each of bridges 10 and 10a respectively conductively connecting the first link portion 3 and the second link portion 4, i.e. bridges 10 and 10a respectively forming secondary conductive links. The bridge or links 10 and 10a may, for example, independently vary from low resistance links such as a few ohms (e.g. 500 ohms) to links with a resistance for example of up to 100K ohms. Although the structure as shown for FIG. 5 is, by way of example, shown as having two conductive bridges 10 and 10a, the structure may as desired or necessary have one or more additional conductive bridges disposed up or down the gap region 5. Thus any such additional conductive bridge(s) may be disposed on either side of conductive bridges 10 and 10a, e.g. between the bridges 10 and 10a; between bridge 10 and spacing link portion 4a, etc.

Figure 6:
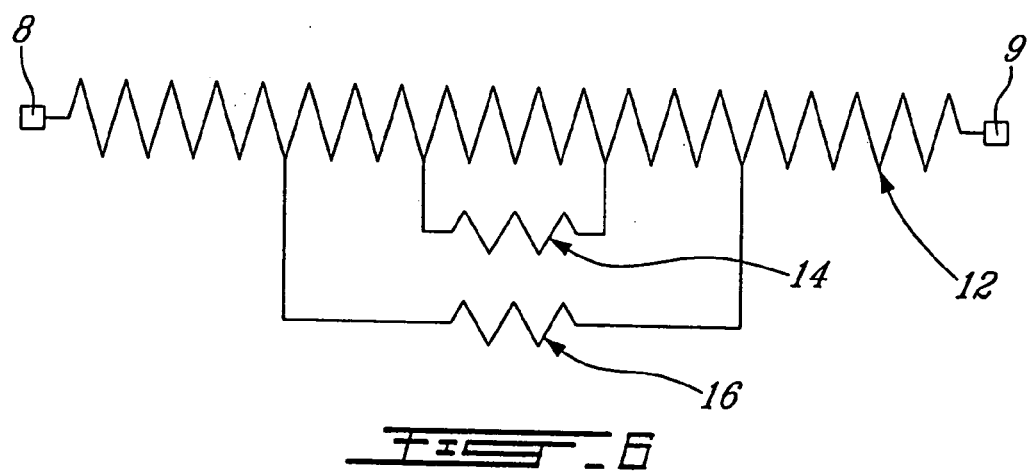
FIG. 6 illustrates an electric schematic of a tuned semiconductor component or device having the aspect of the device of FIG. 5 but with only two conductive bridges.

FIG. 6 illustrates a schematic electrical of the device shown in FIG. 5 but tuned only with the above mentioned bridges 10 and 10a. The reference numeral 12 designates the base or main initial impedance (i.e. resistance) represented by region 2a as a whole. The reference numerals 14 and 16 represent respective secondary resistances defined by bridges 10 and 10a.

Figure 3:
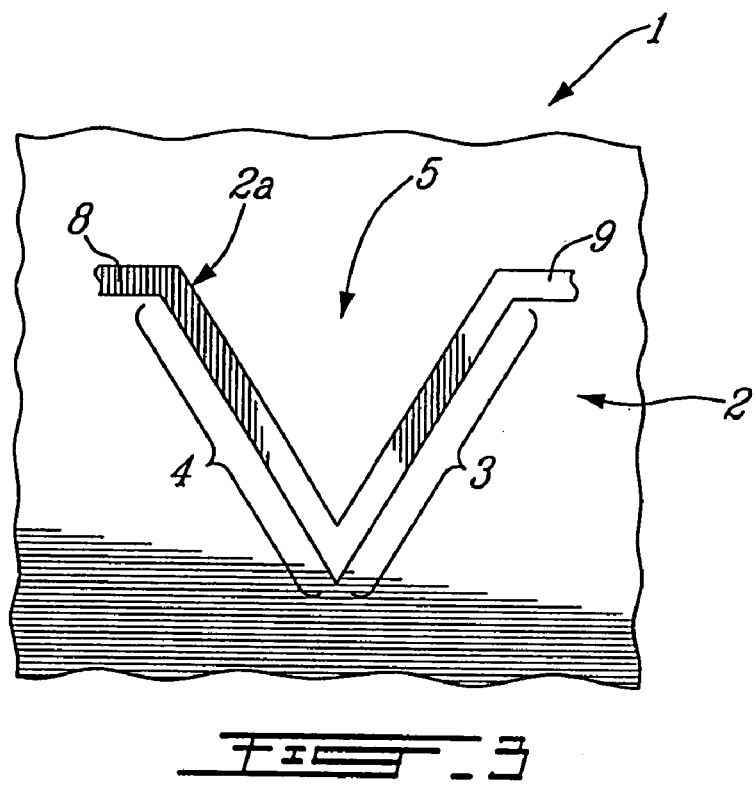
FIG. 3 illustrates schematically another example of a tunable semiconductor component or device in accordance with the present invention, wherein the first conductive region is disposed in the form of a conductive crimp element having a V-like shape configuration or pattern.
Figure 4:
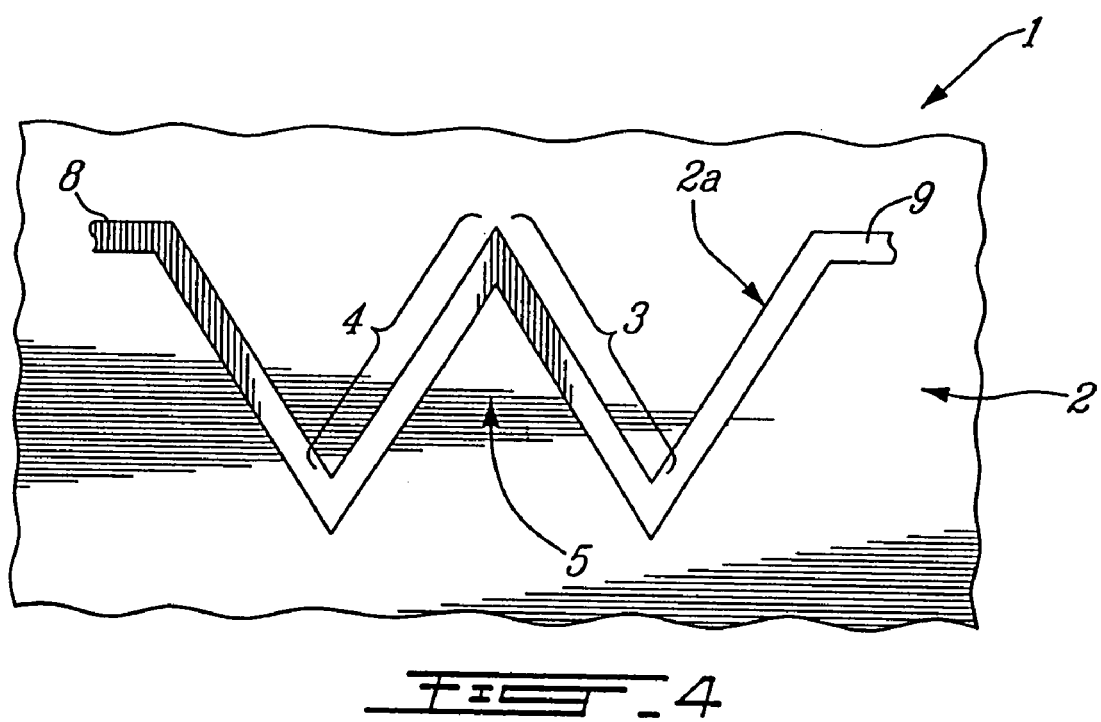
FIG. 4 illustrates schematically another example of a tunable semiconductor component or device in accordance with the present invention, wherein the first conductive region is disposed in the form of a conductive crimp element having a W-like shape configuration or pattern.

Although FIG. 5 shows bridges which are of more or less similar length dimensions, bridges spanning the gap regions 5 for structures such as shown in FIGS. 3 and 4 may not only have different lengths but also different resistances based on such different lengths.

Turning to FIG. 7, arrow 18 depicts the direction of application of a focused heating source pulse onto the semiconductor device 1. As may be understood, a focused heating source may be disposed (not shown) above the integrated semiconductor device 1, and which may apply a pulse 18 to the device 1. As may be understood, the dimensions of the pulse 18 and of the device 1 may not be to scale.

FIG. 7, also shows, in enlarged fashion, a cross sectional view of the tunable integrated semiconductor device 1 through the solidified bridge 10 as shown in FIG. 5. The solidified bridge 10 was obtained by the application of a focused heating pulse 18 to a pre-selected or pre-determined area comprising a portion of lightly doped gap region 5, as well as adjacent portions 19 and 21 of heavily doped link portions 3 and 4 respectively (shown in dotted lines), so as to melt the affected areas and obtain a melted pool (eventually solidifying into bridge 10. As may be appreciated, a portion of heavily doped link portions 3 and 4 is included in the melted pool. The extent of heavily doped regions 3 and 4 which will melt subsequent to the application of the heating pulse 18 may depend on the characteristics of the heating pulse, namely the power of the pulse, the duration of the application of the pulse, the diameter of the pulse, etc. . . . ; the diameter of the heating pulse may for example be such as to span a portion of the gap region and encompass a portion of both of heavily doped link portions 3 and 4. The longer melted pool is melted, the greater the diffusion of dopant from heavily doped regions 3 and 4 into lightly doped region 5. However, the amount of dopants which will diffuse from heavily doped portions 3 and 4 into lightly doped gap region 5 may also depend on how much of heavily doped regions 3 and 4 may be caught by the focused heating beam 18, i.e. if a large part of heavily doped regions 3 and/or 4 are caused to be melted, more dopants may diffuse, and if a small part is caused to be melted, fewer dopants may diffuse. Depending on the length of time that the melted pool remaines melted, the dopant profile across the melted pool from heavily doped region 3 to heavily doped region 4 may not be uniform. Although it is advantageous to form a conductive bridge between link portions 3 and 4 by use of a single heating pulse spanning the gap region 5, it may if so desired be possible to use a plurality of smaller diameter heating pulses. If a plurality of heating pulses are applied they may be applied in stepwise fashion starting for example from an initial step comprising melting a portion of one link portion and an adjacent portion of the gap region 5 and then proceeding in stepwise fashion across the gap region 5 to finally melt a portion of the other link portion and an adjacent portion of the gap region 5.

Figure 9A:
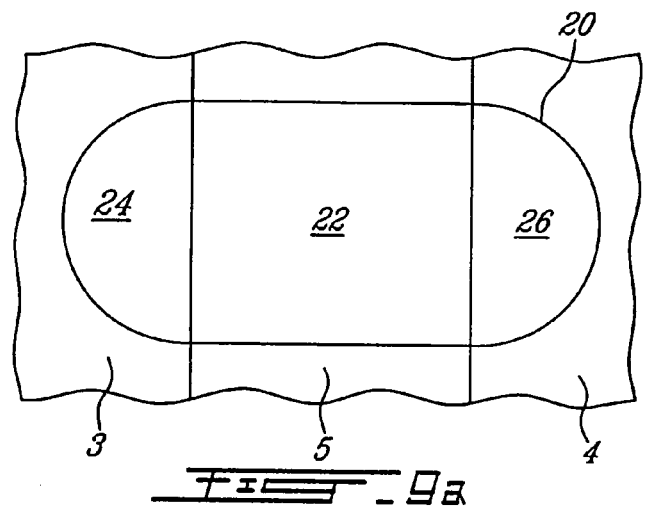
FIGS. 9a, 9b and 9c illustrate in schematic fashion various examples of diferent types of preselected target areas of a preselected bridge area.
Figure 9B:
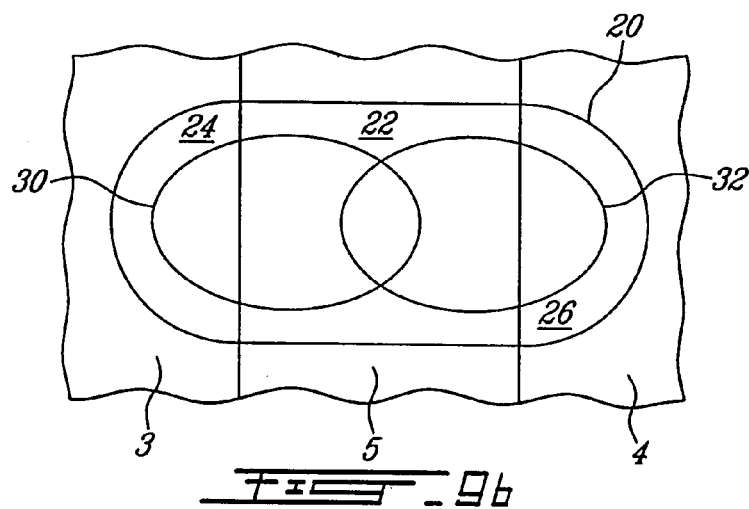
Figure 9C:
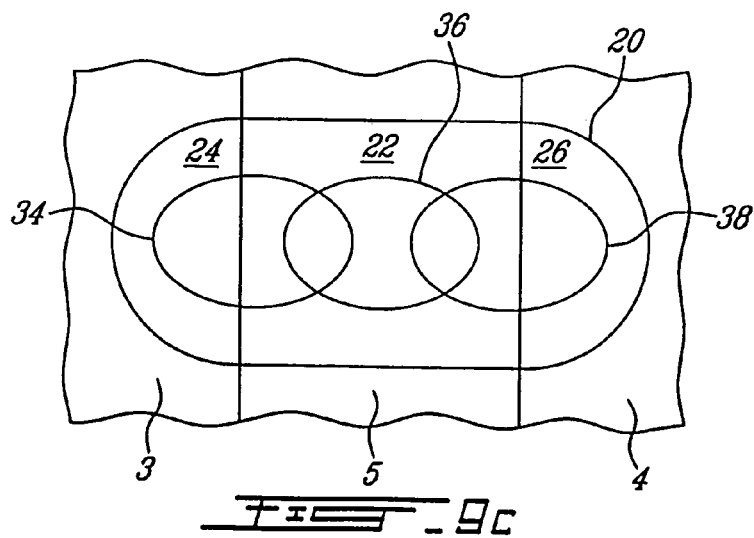

Turning to FIGS. 9a, 9b and 9c, these figures illustrate a number of enlarged example (laser) pulse target areas which are derived from a preselected bridge area for the device as shown in FIGS. 1 to 5; for illustration purposes the bridge area boundary and the target area boundaries for FIGS. 9b and 9c are shown as not being contiguous; for actual applications, after a bridge cycle the boundaries of the bridge area and related target area(s) will be contiguous. The bridge area in each case has a border which is designated by the reference numeral 20. The bridge area as may be seen has a gap component 22, a first link component 24 and a second link component 26; each of these component respectively comprises a portion of gap region 5, first link member 3 and second link member 4. FIG. 9a illustrates a single target area wherein the boundary of the target area is the same as that of the bridge area itself. FIG. 9b illustrates a pair of target areas which, for illustration purposes only, are within the bridge area boundary and have boundaries 30 and 32 which overlap in the gap component. FIG. 9c shows three target areas which, for illustration purposes only, are also within the bridge area boundary and have boundaries 34, 36 and 38 which overlap in the gap component. The target area 36 is subject to the heat cooling treatment after at least one of the other target areas has been so subjected so as to draw dopant from the treated area(s).

Figure 12:
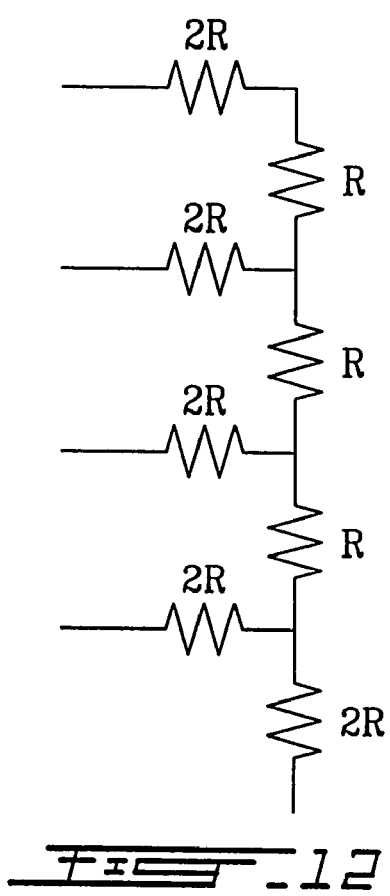
FIG. 12 illustrates an example electric schematic of an R-2R resistor ladder which may be used in a digital to analogue converter.

Turning back to FIGS. 8 and 9 there is illustrated a representation of a general embodiment of an apparatus 100 for modifying the impedance of an integrated semiconductor device using a focused heating source, such as a laser. An integrated circuit 110 is placed on a positioning table 10, and may be subjected to an application of a heating source 105 which is produced by a focused heating source 103. Heating source 105 may be focused on integrated circuit 110 by using optic or magnetic lenses 107, and a system of cameras and mirrors allows for the observation of the integrated circuit 110 in order to ensure accurate alignment of the heating source 105. FIG. 12 shows apparatus 100 in greater detail. Laser 103 is connected to shutter 116, each of which is controlled by the control system shown as a computer 108. Also connected to computer 108 is the control mechanism 109 of the positioners 101. The apparatus 100 further comprises a camera 112, and a light source 114. A further component of the apparatus 100 is a beam splitter 113, and a selective mirror 120.

Turning to FIGS. 10 to 13, these figures illustrate examples of possible applications of the present invention.

FIG. 10 illustrates an example electric schematic of an example series resistor ladder for an analogue to digital converter which provided with a number of resistance members each generally designated as R. FIG. 11 illustrates how the series resistor ladder of FIG. 10 may be formed using a plurality of integrated semiconductor devices as shown in FIG. 5; i.e. each device of FIG. 5 may be disposed so as to each define a respective resistance or impedance member of the analogue to digital converter of example 10; one of the devices, as shown in FIG. 5, and which defines a resistance R is shown as being designated by the reference numeral 130 in FIG. 11. Once the general structure of FIG. 11 is formed by conventional techniques (i.e. laying down of appropriately doped layers, substrates and regions, etc.) fine tuning of each of the members 130 may be carried out as described herein.

Figure 13:
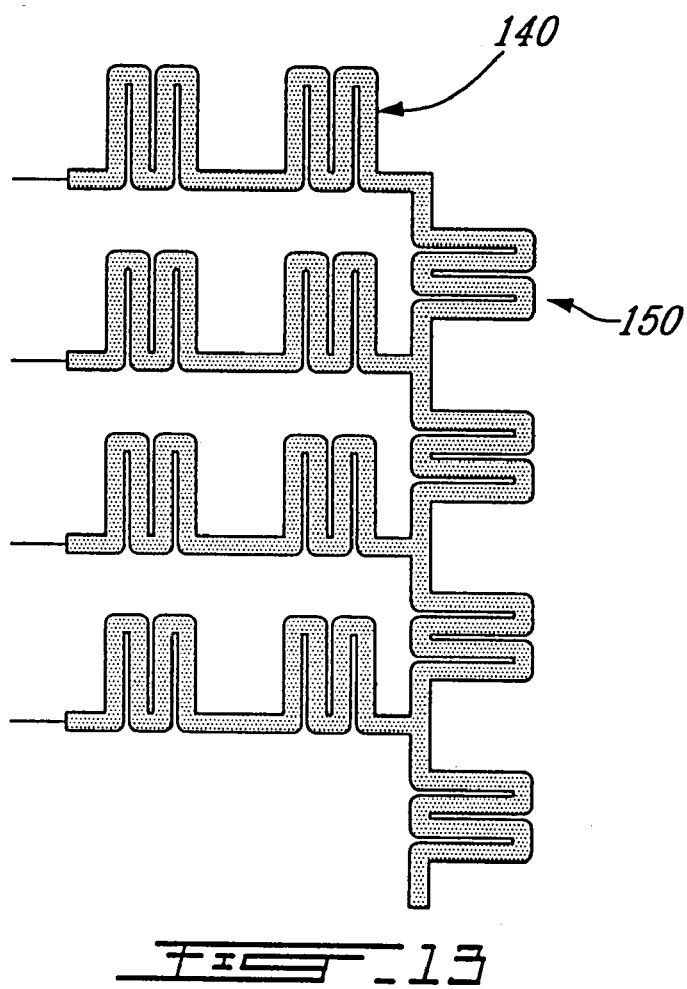
FIG. 13 illustrates how a plurality of the integrated semiconductor device as shown in FIG. 5 may be disposed so as to define the R-2R resistor ladder of FIG. 12.

FIG. 12 illustrates an example electric schematic of an R-2R resistor ladder for a digital to analogue converter provided with a number of resistance members each generally designated either as R or 2R; FIG. 13 illustrates how a plurality of integrated semiconductor devices as shown in FIG. 5 may be disposed so as to define the analogue to digital converter of example 12. Reference numerals 140 and 150 generally designate devices of FIG. 5 which define respectively a resistance R or 2R. Once the general structure of FIG. 13 is formed by conventional techniques (i.e. laying down of appropriately doped layers, substrates and regions, etc.) fine tuning of each of the members 140 and 150 may be carried out as described herein.

FIG. 14 illustrates an example of another tunable integrated semiconductor device of the present invention wherein one of the link portions of the crimp or fold element is not (initially) in the main conductive path. The device 154 comprises various layers or regions, for example, a non-conductive substrate 156, and a conductive layer or region 158 which is contiguous with the underlying substrate 156. In this case, the conductive layer or region 158 comprises a gross, major or large link member or portion 160 and a minor link member or portion 161. The large link portion 160 corresponds to the first conductive link portion which defines the base conductive path of the device; thus the major or large link portion 160, itself alone initially forms the main conductive path between contact members 162 and 164, i.e. current is at least initially able to pass through the entire region 158 between these contact members 162 and 164. The minor link portion 161 which is electrically connected at one end thereof to the major link portion by connector member 168, is spaced apart from the link portion 160 by a gap region 170 which is part of the substrate 156. The impedance (i.e. resistance) of the device of FIG. 14 is modified (i.e. lowered) by providing conductive bridges across the gap region 170 as described above with respect to the device of FIG. 5. The creation of the conductive bridges across the gap region 170 will modify the effective (electrical) dimension of the device so as to slightly change the overall resistance of the device 154. This gaplink configuration may be used to provide a more precise tuning of the resistance of a device than by the devices shown in FIG. 1 to 5.

FIG. 15 illustrates an example combination of an integrated semiconductor device as shown in FIG. 5 with an integrated semiconductor device as shown in FIG. 14 to provide a device which may be tuned with higher precision than would be obtainable by the device of FIG. 5 alone. For this overall device initial tuning of the structure of FIG. 5 may give a precision of for example 0.01% whereas tuning of the structure of FIG. 14 may give an overall precision for the device of 0.001%.

The device or component of FIG. 15 also has contact or connecter members 8 and 174 for electrically connecting the conduction region(s) to other devices, current is at least initially able to pass through the entire region(s) a between these contact members.

Referring to FIG. 16, the same reference numerals as used in FIGS. 1 to 5 to denote common or analogous elements will be used with respect to this figure as well. The device 1 of FIG. 16 as in the case of the devices of FIGS. 1 to 5 has a non-conductive substrate 2, and a sinuous conductive layer or region 2a which is contiguous with the underlying substrate 2. The conductive region 2a is disposed in the form of a conductive crimp element similar to that as set out in FIG. 1 but wherein the top half portion is bent over downwardly. As may be seen, the top portion is bent over downwardly so as to provide the device 1 with an outer U shaped member and an inner U shaped member. The inner U shape member is nested in the outer U shaped member so as to provide the device 1 with a first gap region 5 and a second inner gap region 5a. The first gap region 5 spaces apart the two U shaped members such that the outer U shaped member may be considered to be a first link member as described herein and the inner U shaped member to be a second link member also as described herein. On the other hand, the second inner gap region 5a, also spaces apart portions of the inner U shaped member in a manner reminiscent of the first and second link members as shown in FIG. 1. As a result, the device of FIG. 16 may not only provide for one or more outer conductive bridges such as for example conductive bridges 200 and 202 but also one or more inner conductive bridges such as for example inner conductive bridge 204.

Turning to FIG. 17, this Figure illustrates a electrical schematic of the device shown in FIG. 16 tuned only with the above mentioned bridges 200, 202 and 204. The reference numeral 210 designates the base or main initial impedance (i.e. resistance) represented by region 2a as a whole.

The reference numerals 212, 214 and 216 represent respective secondary resistances defined by bridges 200, 202 and 204 respectively.

We claim:

1. An impedance tunable semiconductor component, said semiconductor component comprising a first laid down conductive region defining a laid down base conductive path, said first conductive region comprising a first conductive element and a second conductive element, said first region being a doped region having a heat modifiable dopant profile, said first conductive element defining said base conductive path and a second region contiguous with the first region, said second region being a doped region having a dopant profile rendering said second region non-conductive relative to said first region, said second conductive element comprising first and second conductive members being disposed in juxtaposition such that said first and second conductive members are separated by a gap region defined by said second region, said second region having a heat modifiable dopant profile, at least with respect to said gap region.

2. An impedance tunable semiconductor component as defined in claim 1 wherein said first and second conductive members are each linked to said first conductive element by a respective laid down conductive connector member.

3. An impedance tunable semiconductor component, said semiconductor component comprising a first laid down conductive region defining a laid down base conductive path, said first conductive region comprising a first conductive member spaced apart from a second conductive member, said first region being a doped region having a heat modifiable dopant profile, said first conductive member defining said base conductive path and a second region contiguous with the first region, said second region being a doped region having a dopant profile rendering said second region non-conductive relative to said first region, said first and second conductive members being disposed in juxtaposition such that said first and second conductive members are separated by a gap region defined by said second region, said second region having a heat modifiable dopant profile, at least with respect to said gap region.

4. An impedance tunable semiconductor component as defined in claim 3 wherein said first and second conductive members are linked together by a laid down conductive connector member.

* * * * *